United States Patent
Meijer et al.

(10) Patent No.: US 7,893,632 B2
(45) Date of Patent: Feb. 22, 2011

(54) LED LUMINAIRE WITH OPTICAL FEEDBACK BY IMAGE MAPPING ON SEGMENTED LIGHT SENSORS

(75) Inventors: Eduard Johannes Meijer, Eindhoven (NL); Ronald Dekker, Eindhoven (NL); Eugene Timmering, Eindhoven (NL); Christoph Gerard August Hoelen, Eindhoven (NL); Johannes Petrus Maria Ansems, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 287 days.

(21) Appl. No.: 11/719,298

(22) PCT Filed: Nov. 15, 2005

(86) PCT No.: PCT/IB2005/053753

§ 371 (c)(1),
(2), (4) Date: Mar. 11, 2009

(87) PCT Pub. No.: WO2006/054234

PCT Pub. Date: May 26, 2006

(65) Prior Publication Data

US 2009/0212709 A1     Aug. 27, 2009

(30) Foreign Application Priority Data

Nov. 19, 2004    (EP)   .................... 04105927

(51) Int. Cl.
*H05B 37/00* (2006.01)
*F21V 5/00* (2006.01)
*F21V 5/04* (2006.01)

(52) U.S. Cl. .............. 315/312; 362/327; 362/335
(58) Field of Classification Search ............. 315/312, 315/307, 291; 362/327, 800, 335; 359/554, 359/555, 556

See application file for complete search history.

(56) References Cited

U.S. PATENT DOCUMENTS

| 6,127,783 | A  | * | 10/2000 | Pashley et al. | ............. 315/149 |
| 6,441,558 | B1 | * | 8/2002  | Muthu et al.   | ............. 315/149 |
| 6,495,964 | B1 | * | 12/2002 | Muthu et al.   | ............. 315/149 |
| 6,741,351 | B2 | * | 5/2004  | Marshall et al.| ............. 356/406 |
| 6,759,814 | B2 | * | 7/2004  | Vogel et al.   | ............. 315/312 |

FOREIGN PATENT DOCUMENTS

JP      07015044 A     1/1995

* cited by examiner

*Primary Examiner*—Douglas W Owens
*Assistant Examiner*—Minh D A

(57) ABSTRACT

The present invention relates to a luminaire comprising an array of LEDs emitting light of at least one color, and a control system for controlling the light output of the luminaire. The control system comprises photosensor array for detecting light output of the luminaire. An imaging unit is arranged in front of the photosensor array such that it maps an image of said array of LEDs on said photosensor array. The photosensor array is divided into subareas each detecting light output from a single one of the LEDs. The control system uses the output of the subareas for controlling the luminaire light output. Thus, it is possible to act on different LED light colors or the light output of individual LEDs without having to separate them in time by means of a time pulsing method.

10 Claims, 4 Drawing Sheets

LED LUMINAIRE WITH OPTICAL FEEDBACK BY IMAGE MAPPING ON SEGMENTED LIGHT SENSORS

FIELD OF THE INVENTION

The present invention relates to a luminaire comprising an array of LEDs (Light Emitting Diodes) emitting differently coloured light, and a control system for controlling the light output of the luminaire.

BACKGROUND OF THE INVENTION

Luminaries having arrays of coloured LEDs, also known as RGB LED luminaries, such as white light emitting luminaries or colour tunable luminaries, are of interest for several reasons. For example, they are low cost and efficient, and the chromaticity of their light output is adjustable.

However, the light output of the LEDs varies from LED to LED, as well as over the lifetime of each LED. Additionally, the light output of the LEDs varies inversely with temperature, and the variation is different for different colours. Many solutions for achieving a stable light output from such luminaries have been tried. In those solutions different kinds of feedback control have been introduced. Thus, the light output is detected and the detections are used for controlling the energising of the LEDs. One prior art solution is disclosed in U.S. Pat. No. 6,127,783, where a white light emitting luminaire has an electronically adjusted colour balance. The luminaire includes a plurality of LEDs in each of the colours red, green and blue, with a separate power supply for each colour and a photosensor array in the form of a photodiode that is arranged to detect the light output of all the LEDs. The light output of each colour is measured by an electronic control circuit, which turns off the LEDs for the colours not being measured in a sequence of time pulses. The measured light output for each colour is compared to a desired output, which may be determined by user inputs, and corrections to the current for each colour are made accordingly.

The thus provided optical feedback control of the LED light require time pulsed measurements to measure the light output for each individual LED light colour, or even for each LED. This is due to the fact that if all LEDs are on the mixed light output of the luminaire is reflected to the photosensor array. The time pulsing is time consuming and significantly limits the maximum output of the luminaire, in particular for luminaries containing a large number of LEDs.

SUMMARY OF THE INVENTION

It is an object of the present invention to eliminate or reduce the prior art drawbacks described above, and provide a luminaire in which the different LED light colours or the light output of individual LEDs are separated without having to separate them in time by means of a time pulsing method.

This object is achieved by a luminaire according to the present invention as defined in claim 1.

Thus, in accordance with an aspect thereof, this invention relates to a luminaire comprising an array of LEDs emitting differently coloured light, and a control system for controlling the light output of the luminaire. The control system comprises a detection unit detecting the light output of the luminaire and a control unit using information from detection unit to control the output of individual LEDs of the array. The detection unit comprises a photosensor array, an imaging unit, and a processing unit. The imaging unit is arranged in front of the photosensor array such that it maps an image of said array of LEDs on said photosensor array. The photosensor array is divided into subareas each detecting light output from a single one of said LEDs. The processing unit is connected to said photosensor array for generating signals corresponding to said subareas.

Due to the partitioning of the photosensor array in subareas and the mapping of an image of the LED array thereon in such a way that light originating from a single LED illuminates one subarea, it is possible to have all LEDs emitting while detecting the light output and still being able to identify the contribution from an individual colour, and even from an individual LED. Each subarea is comprised of one or more sensor array elements.

In accordance with embodiments of the luminaire of this invention, as defined in claims 2 and 3, respectively, the generated signals can be either summary signals for one colour each or individual signals, one for each LED. These embodiments are useful in equal applications.

In accordance with an embodiment of the luminaire of this invention, as defined in claim 5, each subarea consists of a plurality of pixels, i.e. an individual LED is imaged on several pixels. This provides robustness to the control.

In accordance with an embodiment of the luminaire of this invention, as defined in claim 6, internal reflection, rather than direct illumination or an external reflector, is used for performing the imaging. This is advantageous since no extra components and no obstructing objects in the light path are necessary.

In accordance with an embodiment of the luminaire of this invention, as defined in claim 7, the naturally existing fractional reflection at the interface between two media of different refractive indices is used. Thus, no additional reflector element is necessary.

In accordance with an embodiment of the luminaire of this invention, as defined in claim 8, the photosensor array is distanced from the collimator, and consequently from the LEDs within the collimator. Thereby the thermal insulation from the heat producing LED array is simplified in relation to an arrangement internally of the collimator. The insulation is desirable in order to decrease affection on the photosensor array due to thermal fluctuations.

In accordance with an embodiment of the luminaire of this invention, as defined in claim 9, the photosensor array is arranged side by side with the LEDs. This is advantageous in that there are no optical components outside the collimator, and by providing these optical components in one component they are easier to align.

In accordance with an embodiment of the luminaire of this invention, as defined in claim 10, imaging optics is placed on top of, or close to, the photosensor array. Thereby a reduction of the area of the photosensor array is obtainable. This, in turn, reduces the effective area that is not used for light emission. It is to be noted, though, that such a reduction of the photosensor area may be conditioned by a smaller pixel size, which in turn may be dependent on the type of photosensor array.

In accordance with an embodiment of the luminaire of this invention, as defined in claim 11 the optical part of the imaging unit is engaged with or constitutes a portion of the wall of the collimator. Thereby, all or at least a dominant part of the imaging unit is placed in the periphery of the luminaire in conjunction with the photosensor array. Additionally, a larger fraction of the reflected light is coupled out of the collimator to the photosensor array in comparison with another embodiment, as defined in claim 12, where the optical part is distanced from the collimator.

On the other hand, in the latter embodiment the optical part is more easily mounted.

These and other aspects of the invention will be apparent from and elucidated with reference to the embodiments described hereinafter.

BRIEF DESCRIPTION OF THE DRAWINGS

The invention will now be described in more detail and with reference to the appended drawings in which.

DESCRIPTION OF PREFERRED EMBODIMENTS

Figure 1:
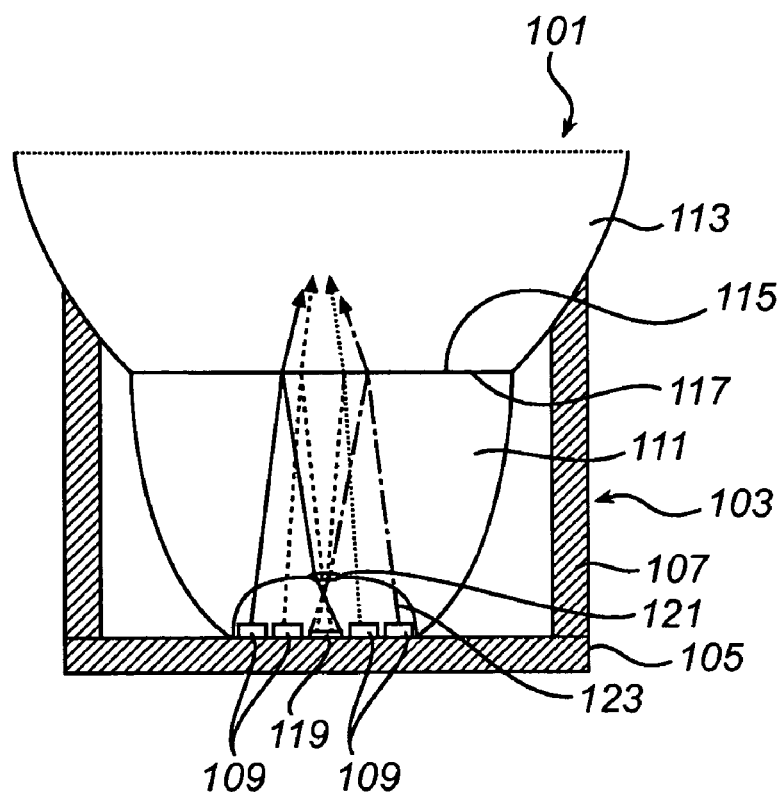
FIG. 1 is a schematic sectional view of a first embodiment of a luminaire according to the present invention.
Figure 5:
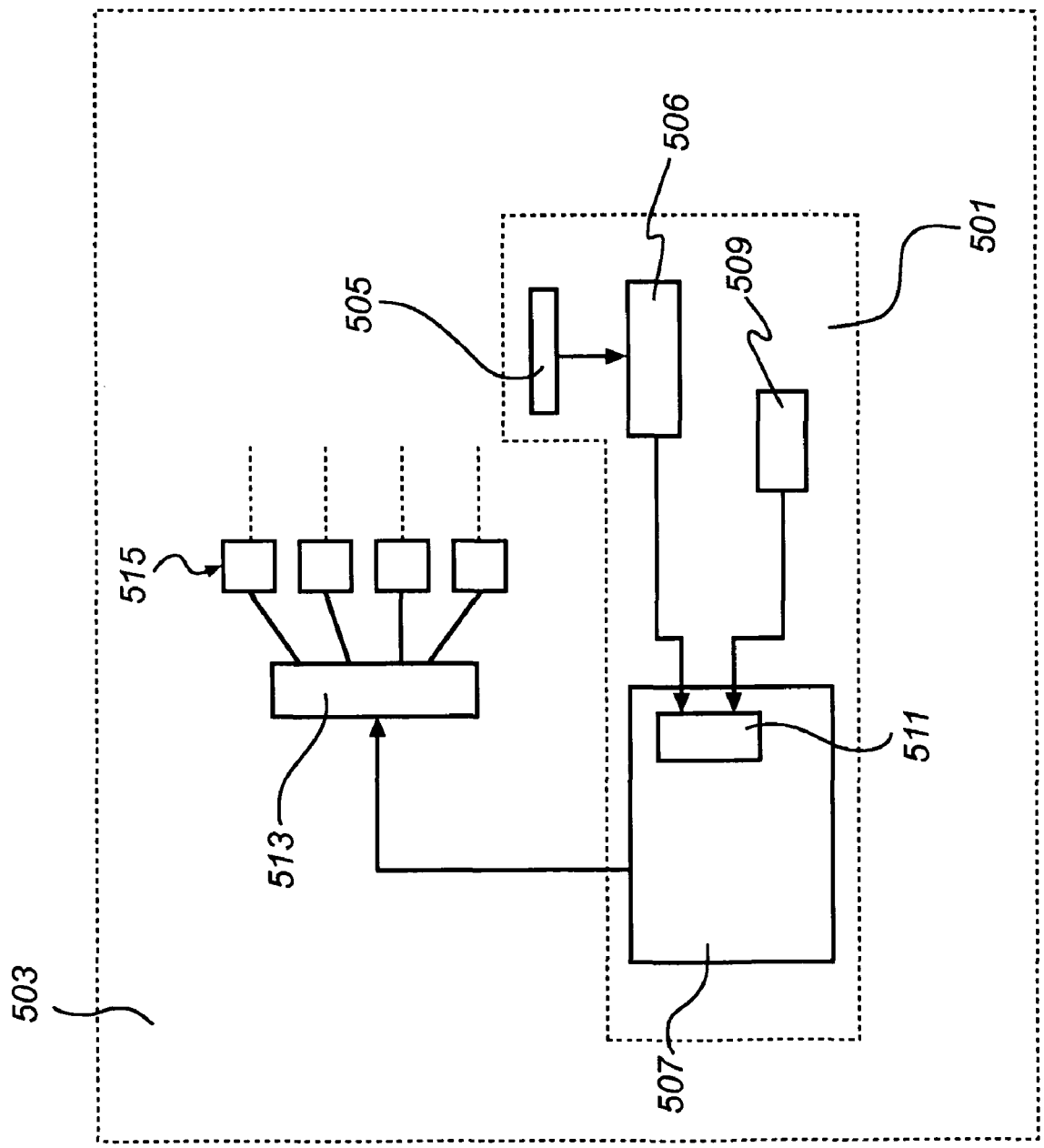
FIG. 5 is a schematic block diagram of an embodiment of a control system employed in the luminaire according to the present invention.

Referring to FIG. 1 a luminaire 101 comprises a cup shaped support structure 103, having a bottom plate 105 and a surrounding wall 107, a plurality of LED chips, or LEDs, 109, which are mounted on top of the bottom plate 105 or on an intermediate submount, i.e. on the inside of the luminaire 101. Further, the luminaire 101 comprises an optical collimator 111, which is arranged within the cup shape of the support structure 103 and surrounds the LEDs 109, and which is facetted and dielectric, and a reflector 113, which is arranged on top of the collimator 111 with a flat surface 115 engaging a corresponding flat surface 117 of the reflector 113. The reflector 113 widens towards the outer end thereof to a width greater than the width of the support structure 103, and is supported by the upper end of the wall 107. The reflector 113 is also facetted and is used for a final beam shaping and homogenisation, i.e. colour mixing, of the light output emitted from the luminaire 101. A photosensor array 119 is mounted on the bottom plate 105 or on a submount or PCB next to the LEDs 109 and at the centre of the bottom plate, i.e. at the longitudinal axis of the luminaire 101. A body 121 of silicon gel covers the LED array and the photosensor array 119. The body 121 has a refractive index that matches the refractive index of the collimator 111 and constitutes an optical contact between the LEDs 109 and the collimator 111. An imaging unit 123 is arranged straight in front of, i.e. above as seen in FIG. 1, the photosensor array 119 at a distance from there. The imaging unit 123 consists of an optical part, and more particularly a lens, that is positioned at the interface between the silicon gel body 121 and the collimator 111. The refractive index of the lens 123 is higher than that of the surrounding material. In an alternative configuration, the refractive index of the lens 123 could be lower than that of the surrounding material, requiring another shape of the lens. The luminaire 101 further comprises a control system 501 as shown by a dashed line in FIG. 5.

The control system 501, in fact constituted, to a large extent, by hardware on a PCB (Printed Circuit Board), can also be mounted on the bottom plate 105 of the support structure 103. The control system 501 is connected to the LEDs 109, denoted 515 in FIG. 5, via a power supply unit 513 energising the LEDs 515, and comprises a detector unit, which comprises a photosensor array 505, corresponding to the photosensor array 119, and a processing unit 506 connected to the detection unit 505. The block diagram is most schematic and primarily has the purpose of disclosing some parts of the control system, and it is meant to be equally relevant for all structurally different embodiments irrespective of the actual position of different parts. There are different alternative photosensor arrays that are usable, such as a photodiode array, a CMOS sensor or a CCD. Such photosensor arrays may include colour filters, as known to a person skilled in the art.

The control system 501 further comprises a control unit 507 for controlling the light output of the luminaire 503, shown by a dashed line, on basis of the detected light, and a reference generation unit 509, which is connected to the control unit 507. The control unit 507 comprises a comparator 511.

The control system 501 operates as follows. The detection unit 505 detects the light output of the luminaire 503. As explained above the detected light is an image of the LED array 515, which typically has been formed of light reflected internally of the luminaire 503. The photosensor array of the detection unit 505 has a plurality of subareas where each subarea receives the light of an individual LED 515. The processing unit 506 generates output signals representing the illumination of the different subareas, i.e. the light output of the different LEDs 515. In the comparator 511 the output signals, i.e. actual values, are compared with reference signals, i.e. desired values, generated by the reference unit 509. The results are processed by the control unit 507, which generates control signals to the power supply unit 513 on basis of, i.e. in dependence of, the result of the comparison. Thus the light output of each LED can be individually controlled by means of the control system 501. Alternatively, the LEDs 515 are not all individually driven, but driven per cluster, thus simplifying the wiring scheme of the LEDs, i.e. reducing the number of drive channels. In that case the light output of these clusters of LEDs can be controlled independently by means of the control system 501.

Figure 2:
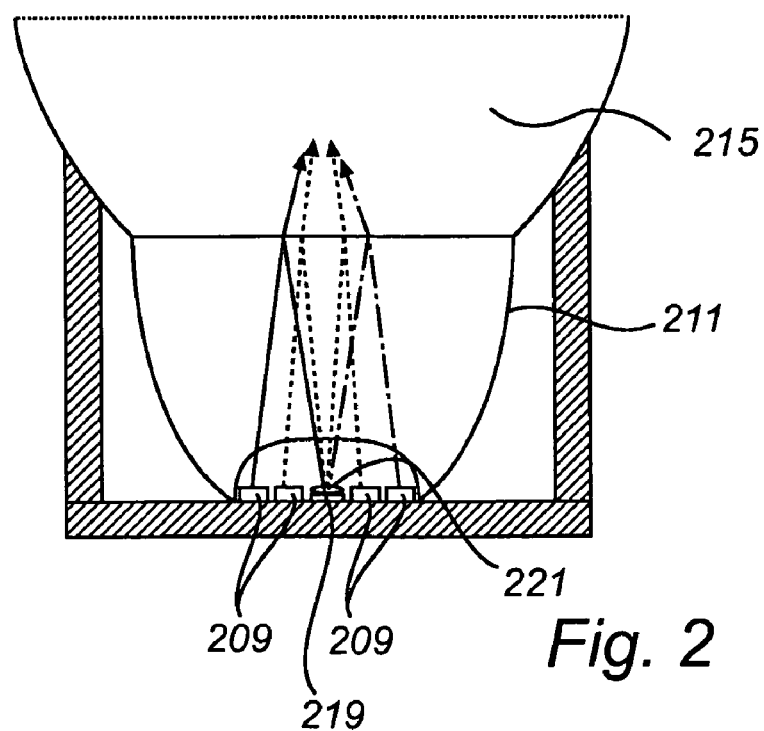
FIG. 2 is a schematic sectional view of a second embodiment of a luminaire according to the present invention.

In FIG. 2 another embodiment is shown. The difference from the embodiment of FIG. 1 is that the lens 221 is arranged in close vicinity of the photosensor array 219.

Alternatively, in the embodiments shown in FIGS. 1 and 2, an optical shield is arranged between the photosensor array 119, 219 and the surrounding LEDs 109, 209 to secure that direct light from the neighbouring LEDs is prevented from reaching the sensors (i.e., light that reaches the sensors without having been reflected at the interface 115, 215). This can be realized by a thin light blocking (preferably reflecting) wall with a height that is at least equal to the height of the LEDs 109, 209.

Figure 3:
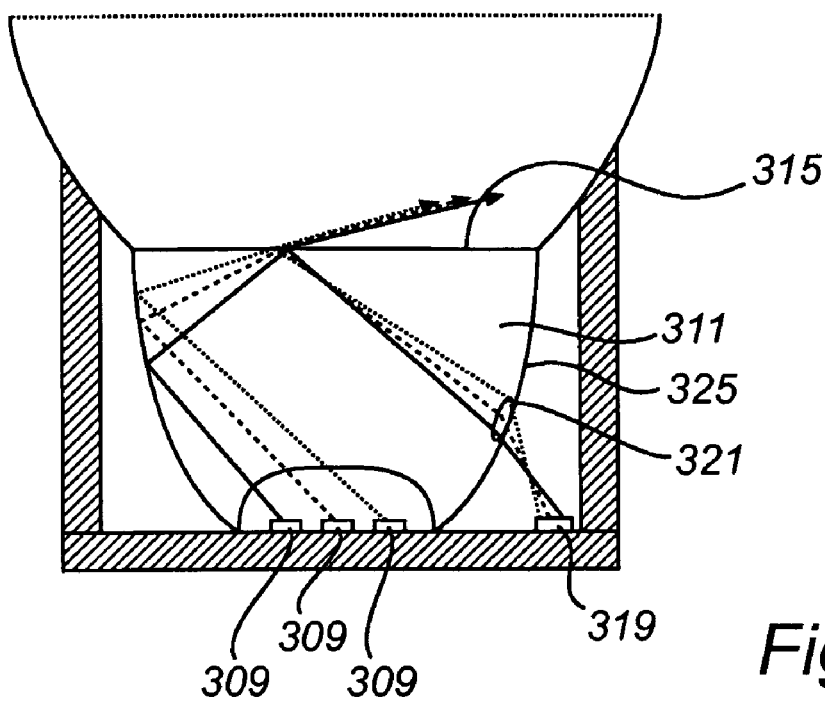
FIG. 3 is a schematic sectional view of a third embodiment of a luminaire according to the present invention.

In FIG. 3 another embodiment is shown. In contrast to the above-described embodiments the photosensor array 319 is mounted outside of the collimator 311 and the imaging unit, i.e. the lens, 321 occupies a portion of the collimator wall 325. In other words, the lens 321 is arranged at the interface between the collimator 311 and the surrounding media, which is air. Preferably, the lens 321 is constructed simultaneously with the moulding of the collimator 311. Here the light emitted from the LEDs 309 is first, partly, reflected on the wall 325 opposite to the lens 321, and then on the inside of the output surface 315 of the collimator 311 before reaching the lens 321. In this embodiment there is full room for the LEDs without any photosensor array that occupies space. On the other hand, it requires a precise alignment of the photosensor array 319 in order to get a good image mapping of the LED array 309.

Figure 3A:
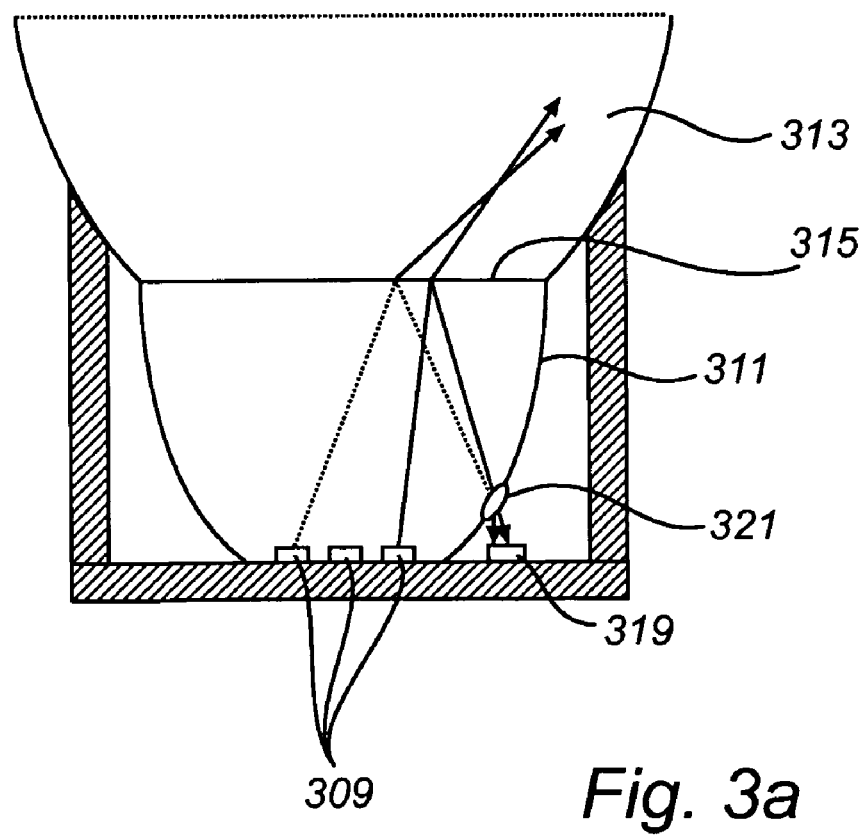

In FIG. 3a another embodiment is shown. It differs from the embodiment shown in FIG. 3 only in that the lens is displaced to such a position that the detected light is only once partly reflected. In other words, only light reflected at the interface 315 is detected by the detector 319. This configuration enables other optical designs of the collimator 311 and/or the reflector 313.

Figure 4:
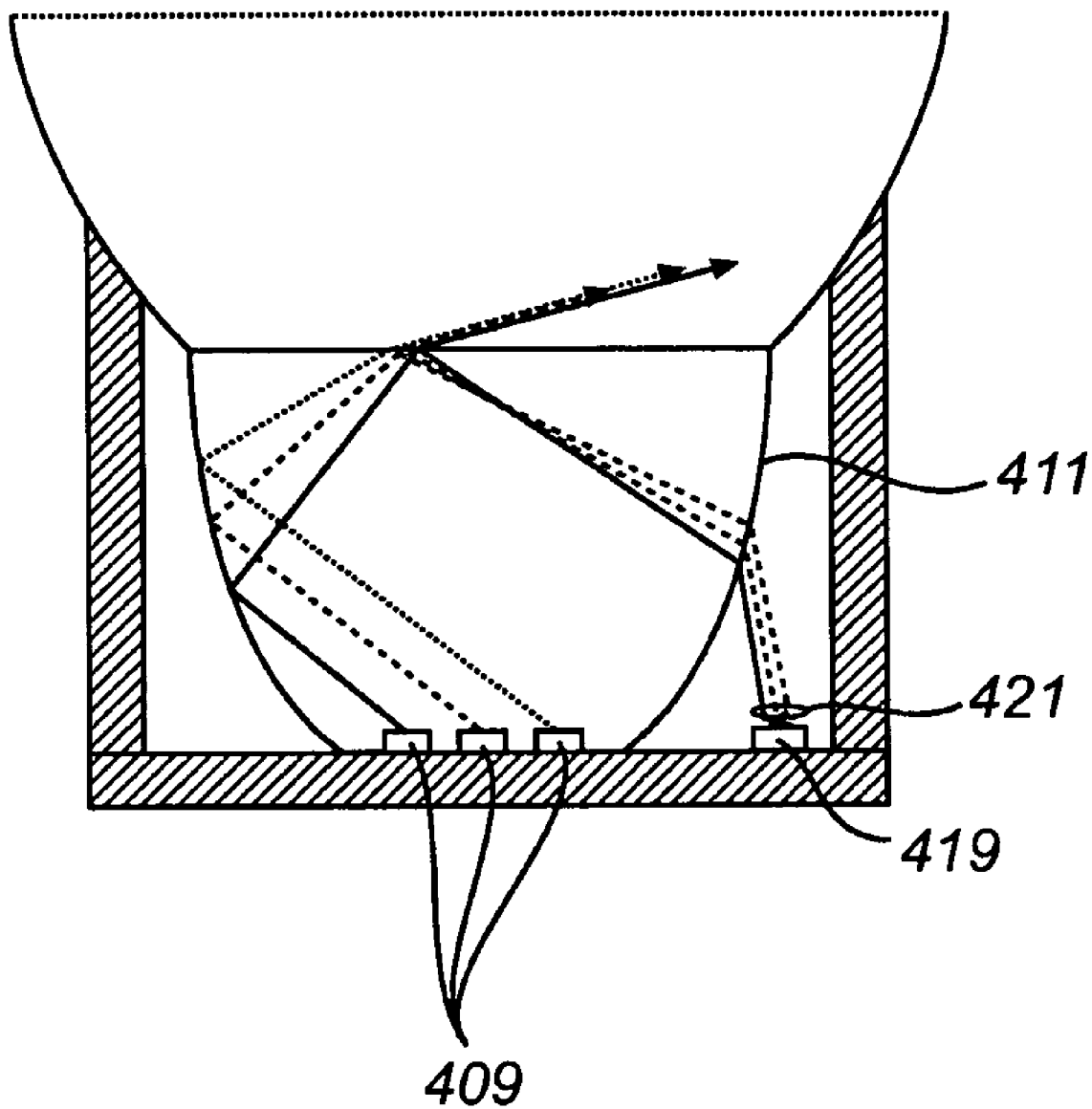
FIG. 4 is a schematic sectional view of a fourth embodiment of a luminaire according to the present invention.

In FIG. 4 another embodiment is shown. The only difference compared to the embodiment in FIG. 3 is that the lens 421 is arranged close to the photosensor array 419, just like in the above-described embodiment shown in FIG. 2. This closeness could also be employed in the embodiment of FIG. 3a. Above, embodiments of the luminaire according to the present invention have been described. These should be seen as merely non-limiting examples. As understood by a skilled person, many modifications and further alternative embodiments are possible within the scope of the invention.

For example, the processing unit can generate output signals not representing individual LEDs but individual light colours. Then the signals representing LEDs having the same colour of the emitted light are combined by the processing unit. Alternatively the combining may be performed already in the detection unit, such that the signals generated by different subareas receiving light of the same colour are added and provide a single signal output from the detector unit to the processing unit.

The imaging unit could comprise multiple lenses and further components, as well as no lens at all but instead other imaging elements.

In the embodiments shown in FIGS. 3 and 4, a pinhole can be applied between the imaging element and the sensor array to reduce detection of unwanted light (background or stray light).

Additionally the optical path from the imaging element to the sensor array, or from the pinhole to the sensor array, can be shielded optically to prevent detection of light by the sensor array that has not passed through the imaging element or pinhole.

In an alternative embodiment, a pinhole is used to image the photodiodes on the sensor array. The pinhole may be a small light transmitting area in a further light blocking medium that is mounted between the collimator and the sensor array. In this case, no lens is used as the imaging element. Alternatively, the pinhole is a small light transmitting area in a reflecting layer that is applied to the outside surface of the collimator. In yet another configuration, the pinhole is a small light transmitting area in a reflector that actually forms the collimator. In the latter case, the dielectric that the LEDs are in optical contact with has the shape of a dome, i.e. the dielectric has a convex outer surface (facing away from the LEDs) apart from the side that is in contact with the LEDs and the mounting plate and/or submount, the dome being located within the collimating reflector. An additional optical element is required in this case to provide some reflected light for sensing of the light output of the illumination system, e.g. by applying a glass plate between the collimator and the (secondary) reflector. This glass plate may have a flat bottom surface to provide specular reflection for the sensor array, and either a flat or a textured top surface. A textured top surface gives the possibility of further enhancement of the mixing of the light emitted by the LEDs, and thus enhancement of the homogeneity of the light emitted by the illumination system. Additional optics (i.e., one or more lenses) may be applied between the pinhole and the sensor array to adjust the dimensions of the image to the size of the sensor array. In the latter case, again a second pinhole may be applied between the additional optics and the sensor array to reduce detection of unwanted light.

Thus, as explained by means of the embodiments above, due to the partitioning of the photosensor array in subareas and the mapping of an image of the LED array thereon in such a way that light originating from a single LED illuminates one subarea, the different LED light colours or the light output of individual LEDs are separated without having to separate them in time by means of a time pulsing method.

It is to be noted, that for the purposes of this application, and in particular with regard to the appended claims, the word "comprising" does not exclude other elements or steps, that the word "a" or "an", does not exclude a plurality, which per se will be apparent to a person skilled in the art. Further, as is understood by a person skilled in the art, the hardware described above at least partly can be realized in software as well.

The invention claimed is:

1. A luminaire, comprising:
an array of LEDs emitting light of at least one colour,
a control system for controlling the light output of the luminaire,
a reflector extending outward from a base, said LED array mounted on said base interior to said reflector;
said reflector including a curved reflector sidewall;
wherein said curved reflector sidewall includes an aperture;
wherein the control system includes a detection unit detecting the light output of the luminaire and a control unit using information from the detection unit to control the output of individual LEDs of said array, said detection unit having:
a photo sensor array mounted exterior of said reflector; and
a lens installed in said aperture of said curved reflector sidewall, which is arranged in front of said photo sensor array such that said lens maps an image of said array of LEDs on to said photo sensor array;
wherein said photo sensor array is divided into subareas,
each of said subareas of said photo sensor array operable to detect light output from a single one of said LEDs; and
a processing unit connected to said photo sensor array for generating signals corresponding to each of said subareas.

2. A luminaire according to claim 1, wherein each one of said generated signals correspond to a different LED light colour.

3. A luminaire according to claim 1, wherein each one of said generated signals is related to the light output of a single LED.

4. A luminaire according to claim 1, wherein each one of said generated signals is related to the light output of a cluster of LEDs emitting the same color of light.

5. A luminaire according to claim 1, wherein each one of said subareas consists of a plurality of pixels of the photo sensor array.

6. A luminaire according to claim 1, wherein said lens is positioned to focus light reflected internally of the reflector onto the exterior photo sensor array.

7. A luminaire according to claim 1, wherein said lens comprises an optical part which is arranged in close vicinity of the photo sensor array.

8. A luminaire according to claim 1, wherein said lens comprises an optical part which constitutes an interface between the collimator and the surrounding environment.

9. A luminaire according to claim 8, wherein the optical part is arranged in close vicinity of the photo sensor array.

10. A luminaire according to claim 1, wherein the lens comprises an optical part which is arranged at a distance from the collimator.

* * * * *